United States Patent [19]
Singer et al.

[11] Patent Number: 5,861,764
[45] Date of Patent: Jan. 19, 1999

[54] CLOCK SKEW REDUCTION USING SPIDER CLOCK TRACE ROUTING

[75] Inventors: James H. Singer, Houston; Joseph Peter Miller, Cypress, both of Tex.

[73] Assignee: Compaq Computer Corporation, Houston, Tex.

[21] Appl. No.: 775,771

[22] Filed: Dec. 31, 1996

[51] Int. Cl.⁶ .................................................. H03K 19/00
[52] U.S. Cl. ............................................. 326/93; 326/101
[58] Field of Search ....................... 326/93, 101; 361/792

[56] References Cited

U.S. PATENT DOCUMENTS

| | | | |
|---|---|---|---|
| 5,140,184 | 8/1992 | Hamamoto et al. | 326/93 |
| 5,239,215 | 8/1993 | Yamaguchi | 326/93 |
| 5,396,129 | 3/1995 | Tabira | 326/93 |
| 5,453,583 | 9/1995 | Rostoker et al. | 174/267 |
| 5,523,920 | 6/1996 | Machuga et al. | 361/767 |
| 5,537,061 | 7/1996 | Honjo | 326/93 |
| 5,686,845 | 11/1997 | Erdal et al. | 326/93 |

*Primary Examiner*—Jon Santamauro
*Assistant Examiner*—Don Phu Le
*Attorney, Agent, or Firm*—Michael F. Heim; Conley Rose and Tayon

[57] ABSTRACT

A technique for reducing skew between clock signals in a digital system requiring multiple clock signals. The system preferably is implemented on a printed circuit board. An oscillator circuit provides a periodic signal to a clock buffer which generates multiple periodic clock signals. The clock signals are provided to various destination points on the printed circuit board. The rising and falling edges of each clock signal generated by the clock buffer do not occur precisely at the same time as the rising and falling edges of the other clock signals. This misalignment of clock edges, or skew, is detrimental to system performance, but is reduced substantially by connecting all of the clock buffer's output clock signals together at a single physical point or node. Accordingly, the printed circuit board traces carrying each of the clock signals are routed to a single point node. A single point node is used to reduce skew caused by the clock buffer. Single point nodes also may be used at various locations on the printed circuit board to reduce skew caused by differences in the lengths of the traces carrying the clock signals.

13 Claims, 6 Drawing Sheets

CLOCK SKEW REDUCTION USING SPIDER CLOCK TRACE ROUTING

BACKGROUND OF THE INVENTION

1. Field of the Invention

The present invention relates generally to clock signals in a digital system. Still more particularly, the present invention relates to the reduction of skew between output clock signals from a clock buffer. Still more particularly, the invention relates to buffer-to-buffer skew reduction by coupling together the output clock signals from a clock buffer.

2. Background of the Invention

The timing of a microprocessor-based circuit is controlled by one or more clock signals. As shown in FIG. 1, a clock signal includes periodic transitions between high (logic "1") and low (logic "0") logic levels at a rate typically described in terms of frequency. Frequency commonly is measured by the number of high/low transitions or cycles that occur each second. Thus, a frequency of 1 Hertz (1 Hz) refers to one high/low cycle occurring each second. Early personal computers operated using clock signals with a frequency of approximately 5 megahertz (MHz) indicating that the clock signal had 5,000,000 cycles each second. Current implementations of personal computers include numerous clock sources with frequencies ranging from 1–200 MHz.

The clock signal in a computer system is used to synchronize bus cycles in the system. Thus, all digital components in the computer system initiate data operations based upon the clock signal. More specifically, circuit components that use a clock signal change the state of their output signals in conjunction with the rising and/or falling edge of the clock signal. For example, in FIG. 1, rising edge 17 or falling edge 18 might be used to control the state of a given circuit component.

Clock signals usually are generated by clock circuits which include multiple clock signal sources (i.e., output buffers for providing a clock signal). Like most digital circuitry, clock circuits typically are fabricated on a printed circuit board. Microprocessor-based circuits are often complex and include numerous electrical components, many of which are driven by a clock signal. Most, if not all, microprocessor-based circuits include multiple clock signals, typically one clock signal source for each destination point requiring a clock signal. The use of multiple clock signals is necessary for numerous reasons such as providing sufficient drive current for all loads requiring a clock signal and improving clock signal quality.

Referring now to FIG. 2, a typical clock circuit 10 includes an oscillator circuit 12 coupled to a clock buffer 14. The oscillator circuit 12 generates a periodic signal at a predetermined frequency. The clock buffer 14 receives the periodic signals from oscillator circuit 12 and generates n output clock signals, labeled in FIG. 2 as clock0, clock1, clock2, through clockn. The output clock signals are produced by output buffers (not shown) in clock buffer 14. The n clock signals couple to multiple destination points $D_1$, $D_2$, $D_3$, through $D_n$ through output series termination resistors $R_0$. The clock signals then are used to drive circuit components located at various sites across the circuit board in accordance with known techniques.

Although occurring extremely rapidly, electrical signals require a finite amount of time to travel from one point to another on a circuit board. The longer the distance through which a signal must travel, the more time it takes for that signal to propagate the required distance. Conductive copper pathways, commonly called traces, are etched in the circuit board to provide conductive paths for signals to travel from one component to another. The length of the traces between output resistors $R_0$ and the various destination points $D_0$, $D_1$, $D_2$, $D_n$ are labeled as $L_0$, $L_1$, $L_2$, $L_n$ in FIG. 2. For example, $L_0$ refers to the distance between resistor $R_0$ and destination point $D_0$. As illustrated in FIG. 2, $L_n$ represents a longer distance than $L_0$. Thus, the time it takes for signal clockn to propagate through trace length $L_n$ to destination point $D_n$ is greater than for clock0 to propagate through trace distance $L_0$. Thus, if the four clock signals clock0, clock1, clock2, clockn are in phase (i.e., their rising and falling edges occur simultaneously) at resistor $R_0$, the rising and falling edges of the clock signals at the destination points will be out of phase. Specifically, the clock signal that propagates through the shortest trace length will have a rising and falling edge that occurs before the associated rising and falling edges of the other clock signals. Moreover, if all of the trace lengths are of different lengths, then all of the clock signals will have rising or falling edges that are out of phase at the respective destination points $D_0$, $D_1$, $D_2$, $D_n$. This phase difference typically is referred to as skew. FIG. 3 illustrates the effects of skewing in the prior art circuit of FIG. 2. Approximately two cycles of clock signals clock0–clockn are shown in which the rising edges 17a, 17b, 17c, 17d are not in phase. Because of the skew between clock signals, the circuit components in a computer, such as address and data latches and state machine flip flops, will change state at different times potentially impairing the performance of the computer system.

The skew between clock signals is further exacerbated by the clock buffer. Typical clock buffers do not produce identical clock signals; that is, the rising and falling edges of the output clock signals do not all occur simultaneously. The maximum skew between the clock signals shown in FIG. 3 is time interval S occurring between the rising edge 17a of clock0 and the rising edge 17d of clockn. Clock buffer manufacturers usually specify a time value for the maximum amount of skew the part may produce. The maximum skew value usually is referred to as buffer-to-buffer skew, referring to the output buffers that drive a clock signal on each of the output terminals of the clock buffer. The maximum buffer-to-buffer skew, for example, for the CGS2535 clock buffer manufactured by National Semiconductor is 250 picoseconds (ps). In computer systems in which speed is of paramount concern, a 250 ps buffer-to-buffer skew represents a significant amount of skewing and may impair the performance of the computer. Thus, reducing or eliminating buffer-to-buffer skew would be beneficial.

At least two attempts have been made to correct or reduce skew in a clock distribution system. In one technique, a prototype circuit board is constructed and the amount of inter-clock signal skew is measured at the destination points. Then the layout of the traces on the printed circuit board is modified to add additional trace length to the faster clock signal traces so that all of the clock signals are substantially in phase at the destination points. This technique thus compensates for skew at the destination points, but does not reduce buffer-to-buffer skew at the clock buffer (i.e., buffer-to-buffer skew is still present at the outputs of the clock buffer). Further, this process is time consuming and expensive, in that the fabrication and testing of a prototype board is required with the subsequent modifications to add precise lengths of additional trace to compensate for the clock signal skew.

A second attempt at overcoming the skew problem is exemplified in FIG. 4. As shown in FIG. 4, 16 output clock signals (i.e., n=16) are shown for clock buffer 14. In this approach, which currently is used in the Compaq Proliant 5000 computer, a trace 50 electrically couples together all of the output terminals of clock buffer 14 in an attempt to produce a single clock signal on trace 50. This single clock signal then is provided to various destination points via output resistors $R_O$. Although this approach may reduce buffer-to-buffer skew somewhat, a substantial amount of skew remains that cannot be reduced further by trace 50. The substantial amount of skew still present in the clock signals results from differences in the trace lengths between the various clock buffer output terminals and the termination resistors $R_O$.

A large portion of the total amount of skewing between clock signals is caused by the clock buffer. Thus, it would be advantageous to reduce, and preferably eliminate, buffer-to-buffer skewing associated with clock buffers. As a direct consequence, computers, and other digital systems, with multiple clock signals could operate faster and more robustly. Despite the advantages such a system would provide, there currently is no system which substantially eliminates the problem with buffer-to-buffer skewing in clock circuits.

BRIEF SUMMARY OF THE INVENTION

The problems outlined above are in large part solved by a technique for reducing skew between clock signals in a digital system with multiple clock signals. The system preferably is implemented on a printed circuit board. An oscillator circuit provides a periodic signal to a clock buffer which generates multiple periodic clock signals. The clock signals are provided to various destination points on the printed circuit board. The rising and falling edges of each clock signal generated by the clock buffer do not occur precisely at the same time creating a phase difference between clock signals. To correct this phase difference, all of the clock buffer output clock signals are connected together at a single physical point or node which is equidistant from each clock buffer output to minimize trace skew (i.e., skew caused by differences in the trace lengths).

Accordingly, the printed circuit board traces carrying each of the clock signals are routed to a single point node. The node preferably includes a small copper pad on the printed circuit board with a surface area of approximately 1/16 square inches. Because of the small size and low resistance of the node, only a single electrical potential exists on the node thereby substantially eliminating skew between multiple clock buffer clock signals. Thus, a single point node is used to reduce skew caused by the clock buffer. The length of traces between the single point node and the destination points may be adjusted to minimize skew resulting from differences in trace length to the destination points, as well as other factors.

In an alternative embodiment, single point nodes also may be used at various locations on the printed circuit board to reduce skew caused by differences in the lengths of the traces carrying the clock signals. The single point nodes preferably are located close to the destination points for each of the clock signals. By electrically coupling together the traces carrying the clock signals at a single point node located close to the destination point, any skew resulting from the difference in lengths of the traces is substantially eliminated. Other traces that couple the single point node to the destination points preferably are approximately the same length to minimize additional sources of skew.

These and other advantages of the present invention will be apparent to one skilled in the art upon reading the following detail description of the invention.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE INVENTION

Figure 5:
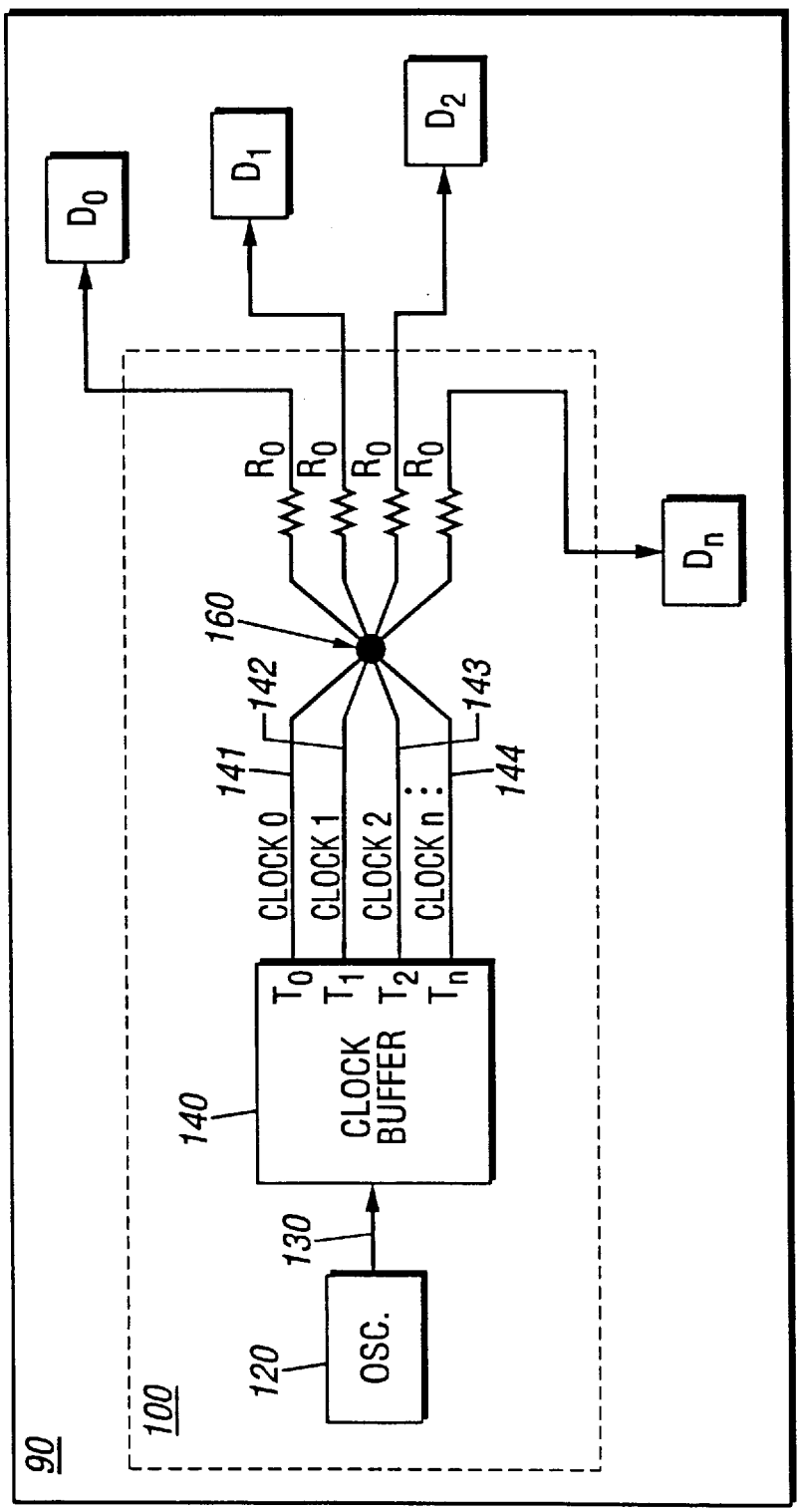
FIG. 5 shows the use of a single point node of the present invention for substantially reducing skewing associated with clock buffers.

Referring now to FIG. 5, a clock circuit 100 constructed in accordance with the preferred embodiment includes an oscillator circuit 120, a clock buffer 140, a single point node 160, and output resistors $R_O$. The circuitry shown preferably is fabricated on a printed circuit board (PCB) 90, although the present invention is applicable to other manufacturing methods. If a printed circuit board is used, the board may be a single or multi-layer board. Oscillator circuit 120 generally includes a commonly known crystal oscillator and associated circuitry, such as resistors and capacitors. Oscillator circuit 120 generates one or more periodic signals on output lines 130 which are provided to clock buffer 140. Clock buffer 140 may be any clock buffer commonly used in microprocessor circuitry such as part number CGS2535, manufactured by National Semiconductor. Clock buffer 140 generates n output clock signals clock0, clock1, clock2, through clockn. The number of output clock signals is not a critical aspect of the present invention. The CGS2535 clock buffer, for example, provides 16 output clock signals, although clock buffers providing more or fewer than 16 clock signals may be used with the present invention. Output buffers (not shown) included in clock buffer 140 provide the output clock signals on output terminals $T_0$, $T_1$, $T_2$, through $T_n$. The clock0–clockn signals generally are routed to multiple destination points on PCB 90. Output resistors $R_O$ function as termination resistors, and determine the clock signal quality and wave shape, as those of ordinary skill in the art will understand.

The present invention substantially reduces the buffer-to-buffer skew normally present in clock buffer 140. Buffer-to-buffer skew reduction generally is achieved by routing traces 141, 142, 143, 144 from clock buffer 140 to a single, physical point or node, labeled as node 160 in FIG. 5. Single point node 160 from which multiple traces emanate have a spider-like appearance in FIG. 5, hence the use of term "spider clock trace routing" in the title. Single point node 160 generally has dimensions sufficiently small so that the propagation time of a clock signal across the node is small relative to the amount of skew desired to be reduced. For example, for a buffer-to-buffer skew of 250 ps, a single point node with a surface area of approximately 1/16 square inches, such as square 1/4" on a side, is acceptable.

Node 160 preferably is a copper pad on the printed circuit board. Although shown in circular form in Figure, single point node 160 includes any shape such as a square or rectangle. Because node 160 has a small surface area, there is negligible resistance across the node and thus a negligible potential difference is produced by clock signals from traces 141, 142, 143, 144 as they traverse the node to resistors $R_0$. With negligible resistance across the node and small dimensions as discussed above, the voltage at any one point on the node is substantially the same as the voltage at any other point on the node. Although multiple skewed clock signals are provided as input signals to single point node 160 via traces 141, 142, 143, 144, there can be substantially only one voltage level at any one point on the node. Thus, node 160 includes only one clock signal and buffer-to-buffer skew is substantially eliminated. In sum, by routing multiple clock signals to a small, single point node 160, a single clock signal is generated at that node which may be provided to destination points $D_0$, $D_1$, $D_2$, $D_n$, through the termination resistors $R_0$. It is preferable that the traces 141, 142, 143, 144 between clock buffer output terminals $T_0$, $T_1$, $T_2$, $T_n$ and node 160 are the same length to minimize additional skew caused by the traces if they had different lengths.

Figure 1:
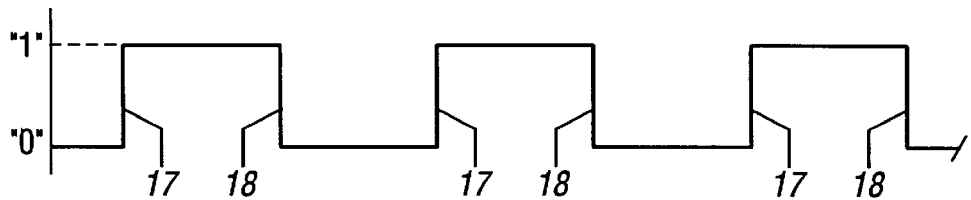
FIG. 1 is an exemplary clock signal waveform.
Figure 2:
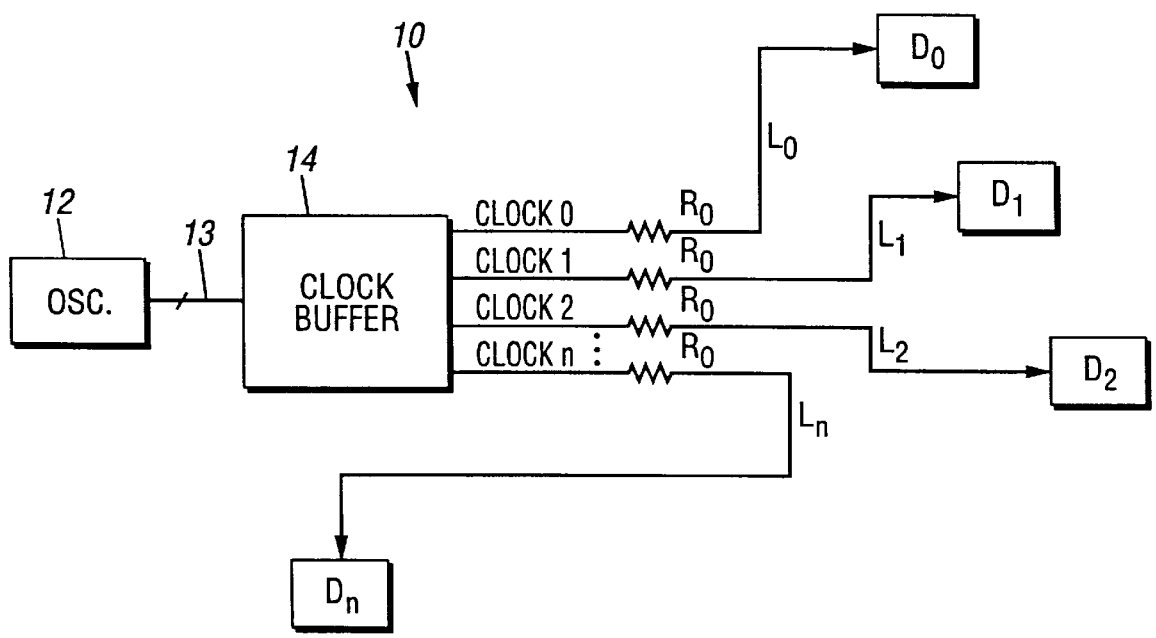
FIG. 2 is a block diagram of a typical clock circuit providing multiple clock signals to multiple destinations.
Figure 3:
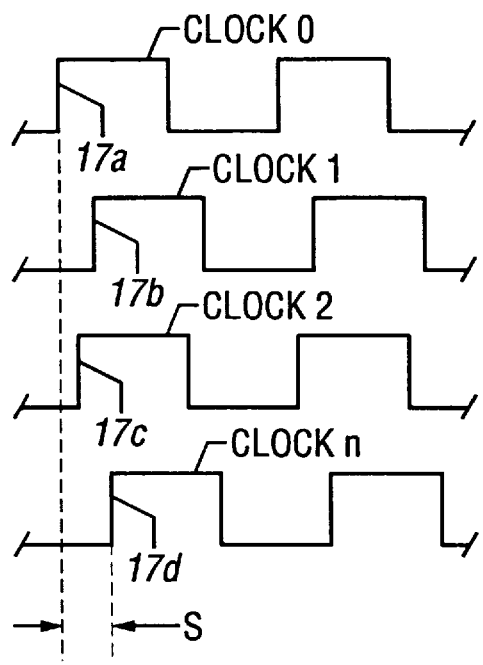
FIG. 3 shows the effects of skewing associated with the clock circuit of FIG. 2.

Although n clock buffer signals and n destination points are shown in FIG. 5, the present invention will allow n clock buffer signals to drive m destination points, where m>n. Thus, not only is buffer-to-buffer skew reduced by using a single point node as described above, but a greater number of destination points can be driven with clock signals than in previous systems in which generally one clock buffer clock signal drives one destination point, as in FIG. 2.

Figure 6:
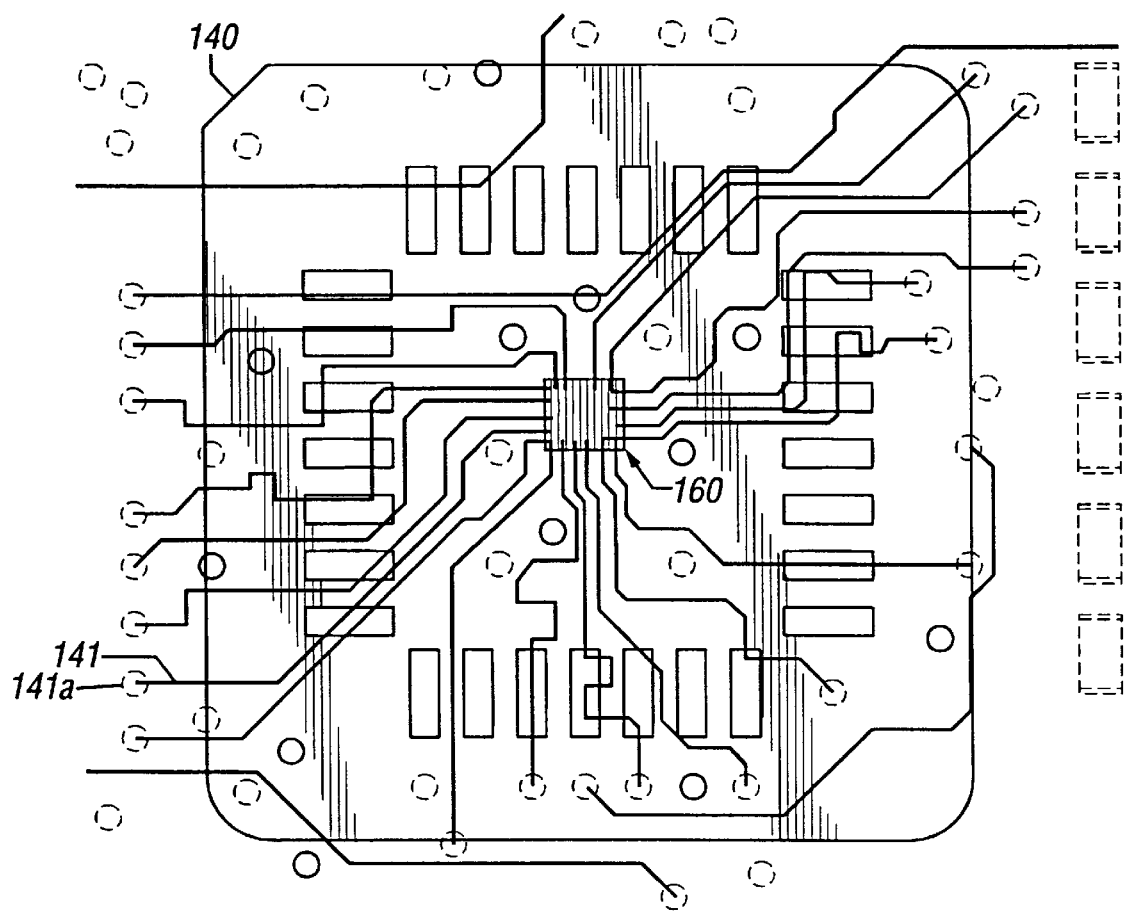
FIG. 6 shows an exemplary trace layout design including the single point node of FIG. 5.

An exemplary trace layout including single point node 160, clock buffer 140, and traces, such as trace 141, is shown in FIG. 6. As state previously, PCB 90 (FIG. 5) may comprise a multi-layer circuit board. Multi-layer PCB's generally include numerous layers and hundreds or thousands of traces. For simplicity, FIG. 6 shows only part of the layer including the traces that connect to single point node 160. The output pins (not shown) of clock buffer 140 are included in a layer not shown and thus the traces from single point node 160, such as trace 141, are shown coupled to via holes, such as via hole 141a. Those of ordinary skill in the art will know that via holes provide connection points between traces on different layers of a multi-layer PCB.

Figure 4:
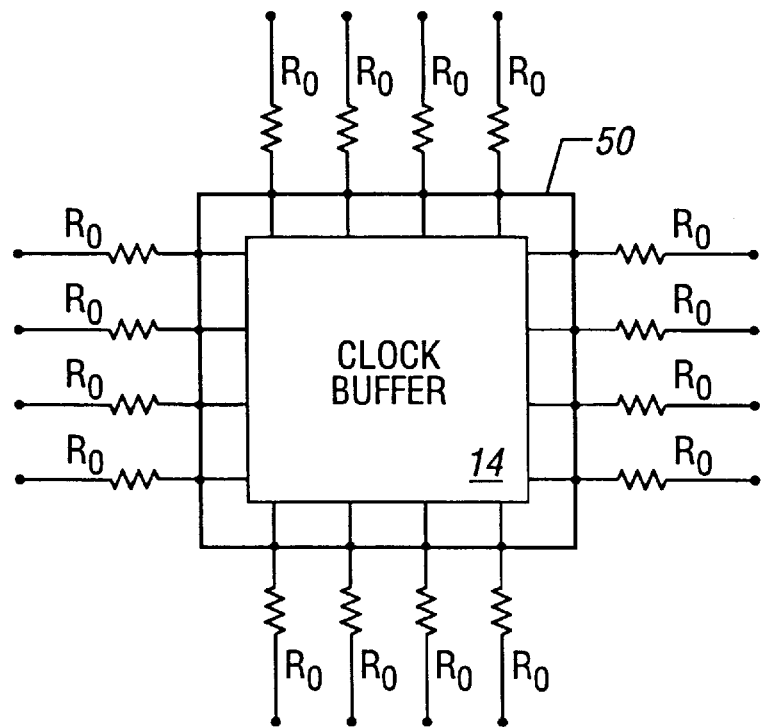
FIG. 4 shows a clock buffer in which the output terminals are coupled together.

In accordance with a preferred embodiment, single point node 160 is shown in FIG. 6 in a layer below clock buffer 140. Locating the single point underneath the clock buffer provides several advantages over previous clock circuits. First, cross talk between various data signals (not shown) located on the sides of the clock buffer and the clock signals is minimized as the single point node 160 is located away from the sources of cross talk. Second, in contrast to a ring connection around the clock buffer as in FIG. 4, locating the single point node underneath the clock buffer reduces the amount of board space necessary for routing clock traces.

Figure 7:
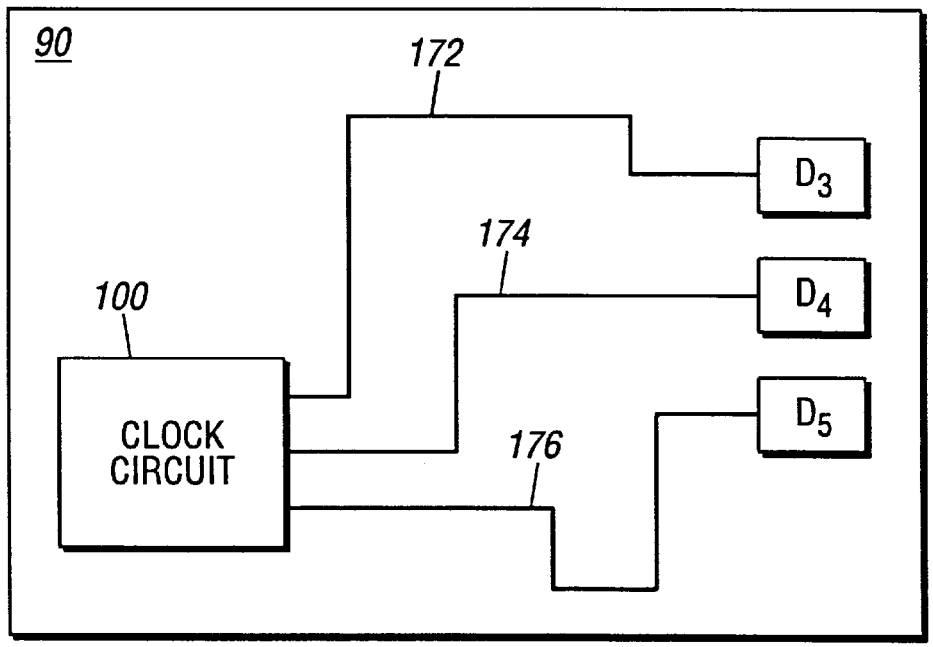
FIG. 7 shows traces of different lengths through which clock signals pass to the same general area of a printed circuit board, thereby introducing skew into the clock signals.

Referring now to FIG. 7, clock circuit 100 couples to destination points $D_3$, $D_4$, $D_5$ via traces 172, 174, and 176. Because two traces cannot cross each other without shorting one trace to the other, traces on a printed circuit board generally are not routed in straight lines from one point to another. Although traces 172, 174, 176 have the same general end points on PCB 90 (i.e., clock circuit 100 and destination points $D_3$, $D_4$, $D_5$), the traces may necessarily have different lengths. Thus, although a single point node in clock circuit 100 may substantially reduce skew between clock signals, by the time the clock signals on traces 172, 174, 176 reach the destination points $D_3$, $D_4$, $D_5$, a significant amount of skew may be present between the clock signals. Other factors such as device loading and board process changes also contribute to skewing.

Figure 8:
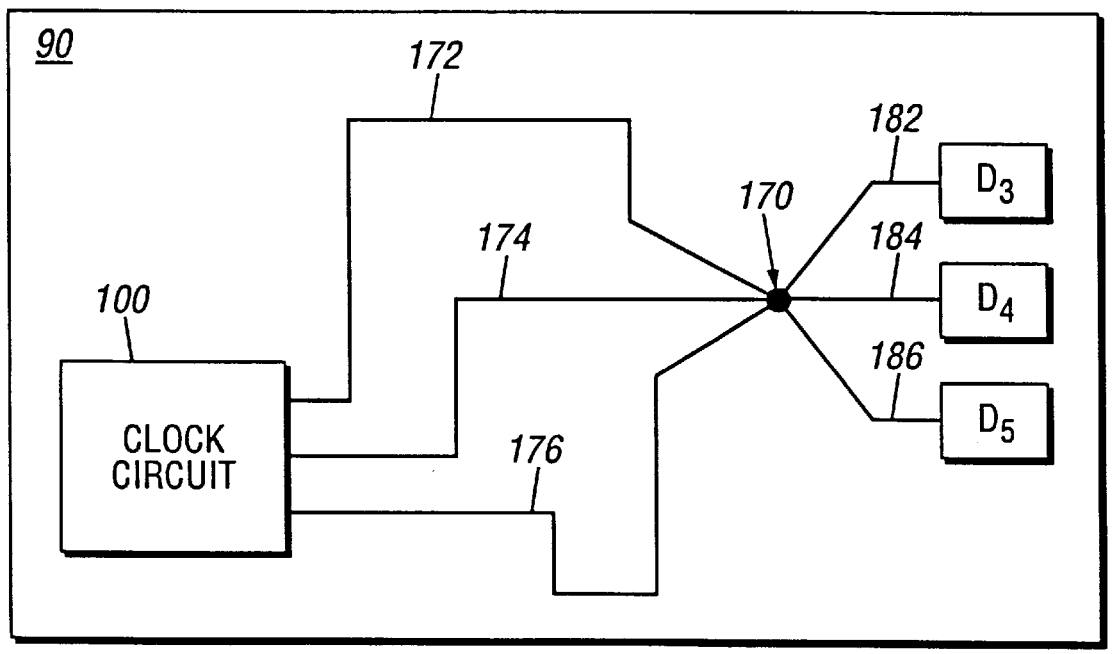
FIG. 8 shows the use of a single point node to reduce the skew caused by the different length traces of FIG. 7.

The single point node described above for reducing buffer-to-buffer skew in a clock buffer can also be used in an alternative embodiment to reduce skew resulting from different length traces between clock circuit 100 and the destination points. Referring now to FIG. 8, a single point node 170 reduces the skew introduced into the clock signals on traces 172, 174, 176. Single point node 170 functions similar to single point node 160 in FIG. 5 and creates a single clock signal on node 170. That single clock signal is provided to destination points $D_3$, $D_4$, $D_5$ via traces 182, 184, 186. Traces 182, 184, 186 preferably are substantially the same length to minimize additional skew caused by differences in trace length.

Figure 9:
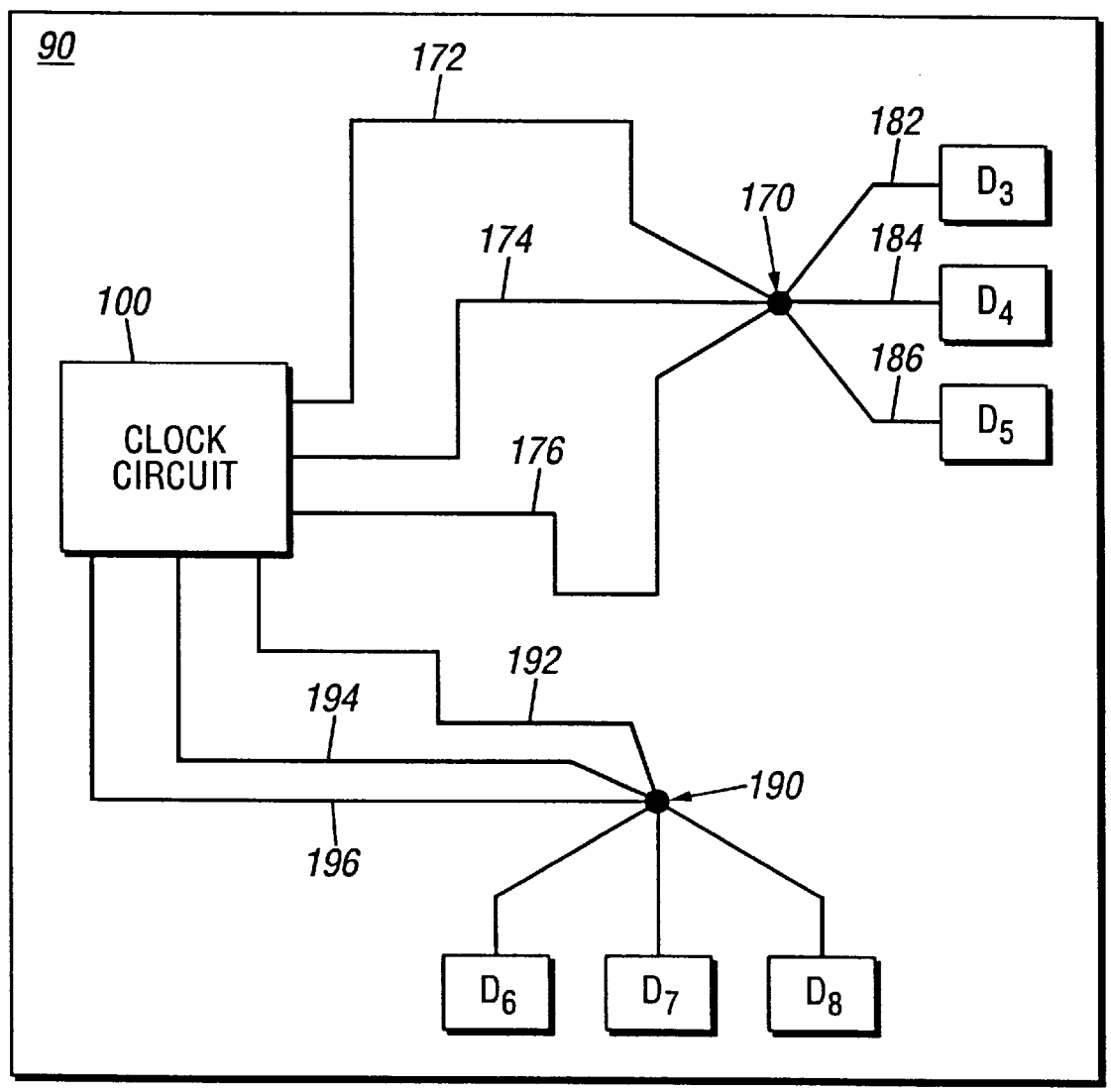
FIG. 9 shows the use of multiple single point nodes consistent with the present invention to reduce clock signal skew caused by differences in trace length illustrated in FIG.

It should be recognized that multiple single point nodes, similar to node 170, can be used at different locations on the circuit board. Referring now to FIG. 9, clock circuit 100 provides six clock signals to six destination points $D_3$, $D_4$, $D_5$, $D_6$, $D_7$, $D_8$. Destination points $D_3$, $D_4$, $D_5$ are located in the same general area 187 of PCB 90 and destination points $D_6$, $D_7$, $D_8$ are located in the same general area 197 of PCB 90. Traces 172, 174, 176 provide conductive paths for clock signals directed to destination points $D_3$, $D_4$, $D_5$, while traces 192, 194, 196 provide conductive paths for clock signals directed to destination points $D_6$, $D_7$, $D_8$. As described above with reference to FIG. 8, single point node 170 reduces the skew caused by differences in the lengths of traces 172, 174, 176. Similarly, single point node 190 also reduces skew caused by differences in the lengths of traces 192, 194, 196. Moreover, single point nodes can be used to reduce the amount of skew between clock signals on different traces for clock signals provided to the same general area of a circuit board.

Numerous variations and modifications will become apparent to those skilled in the art once the above disclosure is fully appreciated. It is intended that the following claims be interpreted to embrace all such variations and modifications.

We claim:

1. A clock circuit providing a plurality of clock signals, said clock circuit reducing buffer-to-buffer skew associated with the plurality of clock signals, comprising:

an oscillator circuit providing a periodic signal;

a clock buffer receiving said periodic signal from said oscillator circuit and generating the plurality of clock signals;

a set of conductive paths connecting said clock buffer to a common single point node and at least one of the plurality of clock signals being transmitted on at least one of the set of conductive paths.

2. The clock circuit of claim 1 further including a second set of conductive paths for providing clock signals to said set of destination devices.

3. The clock circuit of claim 2 further including termination resistors disposed between said second set of conductive paths and said set of destination devices.

4. The clock circuit of claim 3 wherein said first set and said second set of conductive paths comprise traces on a printed circuit board.

5. The clock circuit of claim 3 wherein said first set of conductive paths are substantially the same length.

6. The clock circuit of claim 3 wherein said single point node includes a surface area of approximately 1/16 square inches.

7. The clock circuit of claim 6 wherein said single point node comprises a copper pad.

8. A clock circuit on a printed circuit board providing a plurality of clock signals, comprising:

an oscillator circuit providing a periodic signal;

a clock buffer receiving said periodic signal from said oscillator circuit and generating the plurality of clock signals;

a set of traces coupling said clock buffer to a set of destination devices with at least one of the plurality of clock signals being transmitted on at least one of the set of traces to at least one of the destination devices;

a second set of traces for providing clock signals to said set of destination devices; and a plurality of termination resistors disposed between said second set of traces and said second set of destination devices;

a single point node coupled to each of the sets of traces;

said set of traces and said second set of traces are on a printed circuit board;

wherein said printed circuit board includes multiple layers and said single point node is located in a layer underneath said clock buffer.

9. A digital system in which skew between clock signals is reduced, said digital system constructed on a printed circuit board, comprising:

a clock circuit for generating a plurality of periodic clock signals;

a plurality of destination points for receiving said periodic clock signals; and a first plurality of traces connecting said periodic clock signals from said clock circuit to a common single point node on said printed circuit board.

10. The digital system of claim 9 further including a second plurality of traces on said printed circuit board for electrically coupling said single point node to said destination points.

11. The digital system of claim 10 wherein said single point node includes a surface area of approximately 1/16 square inches.

12. The digital system of claim 11 wherein said destination points are located in approximately the same area of said printed circuit board.

13. A digital system in which skew between clock signals is reduced, said digital system constructed on a printed circuit board, comprising:

a clock circuit for generating a plurality of periodic clock signals;

a plurality of destination points for receiving said periodic clock signals;

a signal point node with a surface area of approximately 1/16 square inches disposed between said clock circuit and said destination points;

a first plurality of traces for coupling said periodic clock signals from said clock circuit to said single point node;

a second plurality of traces for coupling said single point node to said destination points;

wherein said destination points are located in approximately the same area of said printed circuit board; and further including additional single point nodes for electrically coupling together clock signals generated by said clock circuit.

* * * * *